(12) United States Patent
Stevens et al.

(10) Patent No.: US 9,627,194 B2
(45) Date of Patent: Apr. 18, 2017

(54) METHODS FOR MASKING AND APPLYING PROTECTIVE COATINGS TO ELECTRONIC ASSEMBLIES

(71) Applicant: HZO, Inc., Draper, UT (US)

(72) Inventors: Blake Stevens, Morristown, NJ (US); Max Sorenson, Cottonwood Heights, UT (US); Sidney Edward Martin, III, Murray, KY (US)

(73) Assignee: HZO, Inc., Draper, UT (US)

( * ) Notice: Subject to any disclaimer, the term of this patent is extended or adjusted under 35 U.S.C. 154(b) by 0 days.

(21) Appl. No.: 14/542,318

(22) Filed: Nov. 14, 2014

(65) Prior Publication Data

US 2015/0072452 A1    Mar. 12, 2015

Related U.S. Application Data

(63) Continuation of application No. 13/737,709, filed on Jan. 9, 2013, now abandoned.
(Continued)

(51) Int. Cl.
*H05K 3/28* (2006.01)
*H05K 3/00* (2006.01)
(Continued)

(52) U.S. Cl.
CPC ...... *H01L 21/02299* (2013.01); *B05C 21/005* (2013.01); *H01L 21/027* (2013.01);
(Continued)

(58) Field of Classification Search
CPC .............................. H05K 3/284; H05K 3/0073
(Continued)

(56) References Cited

U.S. PATENT DOCUMENTS

| 4,059,708 A | 11/1977 | Heiss, Jr. et al. |
| 4,234,357 A | 11/1980 | Scheppele |

(Continued)

FOREIGN PATENT DOCUMENTS

| EP | 0350031 A2 | 1/1990 |
| EP | 0 474 194 B1 | 1/1997 |

(Continued)

OTHER PUBLICATIONS

United States Patent and Trademark Office Acting as the International Searching Authority, "International Search Report and Written Opinion" mailed Mar. 13, 2013, in related international application No. PCT/US2013/020850.

(Continued)

*Primary Examiner* — Nathan Milakovich
(74) *Attorney, Agent, or Firm* — Kunzler Law Group

(57) ABSTRACT

One or more masks may be used to control the application of protective (e.g., moisture-resistant, etc.) coatings to one or more portions of various components of an electronic device during assembly of the electronic device. A method for applying a protective coating to an electronic device includes assembling two or more components of the electronic device with one another. A mask may then be applied to the resulting electronic assembly. The mask may shield selected portions of the electronic assembly, while other portions of the electronic assembly, i.e., those to which a protective coating is to be applied, may remain exposed through the mask. With the mask in place, application of a protective coating to portions of the electronic assembly exposed through the mask may commence. After application of the protective coating, the mask may be removed from the electronic assembly. Embodiments of masked electronic assemblies are also disclosed.

13 Claims, 2 Drawing Sheets

Related U.S. Application Data

(60) Provisional application No. 61/584,939, filed on Jan. 10, 2012.

(51) Int. Cl.

| | | |
|---|---|---|
| *H01L 21/02* | (2006.01) | |
| *H05K 1/02* | (2006.01) | |
| *B05C 21/00* | (2006.01) | |
| *H01L 21/027* | (2006.01) | |
| *H01L 23/00* | (2006.01) | |

(52) U.S. Cl.
CPC ............ *H01L 23/564* (2013.01); *H05K 1/02* (2013.01); *H05K 3/28* (2013.01); *H05K 3/284* (2013.01); *H01L 2924/0002* (2013.01); *H05K 3/0073* (2013.01); *Y10T 29/49002* (2015.01)

(58) Field of Classification Search
USPC ................. 361/748; 174/256; 427/96.1, 96.2
See application file for complete search history.

(56) References Cited

U.S. PATENT DOCUMENTS

| | | | |
|---|---|---|---|
| 4,254,174 A | | 3/1981 | Flanders et al. |
| 4,255,469 A | | 3/1981 | McGinness |
| 4,300,184 A | | 11/1981 | Colla |
| 4,753,819 A | * | 6/1988 | Shimada ............... B05B 1/04 427/207.1 |
| 4,784,310 A | | 11/1988 | Metzger et al. |
| 4,814,943 A | | 3/1989 | Okuaki |
| 4,826,705 A | | 5/1989 | Drain et al. |
| 5,102,712 A | | 4/1992 | Peirce et al. |
| 5,166,864 A | * | 11/1992 | Chitwood ............ H05K 1/0218 174/351 |
| 5,176,312 A | | 1/1993 | Lowenthal |
| 5,188,669 A | | 2/1993 | Donges et al. |
| 5,246,730 A | | 9/1993 | Peirce et al. |
| 5,271,953 A | | 12/1993 | Litteral |
| 5,368,899 A | * | 11/1994 | Litteral ................. B05C 3/10 427/512 |
| 5,460,767 A | | 10/1995 | Sanftleben et al. |
| 5,543,008 A | | 8/1996 | Hidber et al. |
| 5,669,971 A | * | 9/1997 | Bok ................... B05B 17/0615 118/300 |
| 5,888,308 A | | 3/1999 | Sachdev et al. |
| 6,280,821 B1 | | 8/2001 | Kadunce et al. |
| 6,447,847 B1 | | 9/2002 | Hynes et al. |
| 6,592,018 B2 | | 7/2003 | Taylor et al. |
| 6,635,553 B1 | | 10/2003 | DiStefano et al. |
| 6,697,217 B1 | | 2/2004 | Codilian |
| 6,940,022 B1 | | 9/2005 | Vinciarelli et al. |
| 7,109,055 B2 | | 9/2006 | McDonald et al. |
| 7,273,767 B2 | | 9/2007 | Ong et al. |
| 7,481,107 B2 | | 1/2009 | Itakura et al. |
| 7,632,698 B2 | | 12/2009 | Hooper et al. |
| 8,002,948 B2 | | 8/2011 | Haubrich et al. |
| 2003/0143845 A1 | | 7/2003 | Mori et al. |
| 2004/0056039 A1 | | 3/2004 | Sarajian |
| 2004/0058070 A1 | | 3/2004 | Takeuchi et al. |
| 2004/0065554 A1 | | 4/2004 | Cohen |
| 2005/0008848 A1 | | 1/2005 | Saccomanno et al. |
| 2006/0186901 A1 | | 8/2006 | Itakura et al. |
| 2006/0199408 A1 | | 9/2006 | Hoisington et al. |
| 2007/0095368 A1 | | 5/2007 | Girard et al. |
| 2007/0157457 A1 | | 7/2007 | Fried |
| 2007/0246820 A1 | | 10/2007 | Zohni et al. |
| 2008/0147158 A1 | | 6/2008 | Zweber et al. |
| 2009/0263581 A1 | | 10/2009 | Martin, III et al. |
| 2009/0263641 A1 | | 10/2009 | Martin, III et al. |
| 2009/0283574 A1 | | 11/2009 | Okazaki et al. |
| 2009/0301770 A1 | | 12/2009 | Cho et al. |
| 2009/0304549 A1 | | 12/2009 | Coulson |
| 2010/0124010 A1 | | 5/2010 | Shiu et al. |
| 2010/0203347 A1 | | 8/2010 | Coulson |
| 2010/0277921 A1 | | 11/2010 | Sekowski et al. |
| 2010/0293812 A1 | | 11/2010 | Coulson |
| 2011/0090658 A1 | | 4/2011 | Adams et al. |
| 2011/0094514 A1 | | 4/2011 | Rakow et al. |
| 2011/0262740 A1 | | 10/2011 | Martin, III et al. |
| 2012/0070145 A1 | | 3/2012 | Wong et al. |
| 2012/0146212 A1 | | 6/2012 | Daubenspeck et al. |
| 2013/0174410 A1 | | 7/2013 | Stevens et al. |
| 2013/0176700 A1 | | 7/2013 | Stevens et al. |
| 2013/0182360 A1 | | 7/2013 | Stevens et al. |
| 2013/0251889 A1 | | 9/2013 | Cox et al. |
| 2013/0286567 A1 | | 10/2013 | Sorenson et al. |
| 2013/0335898 A1 | | 12/2013 | Stevens et al. |
| 2014/0190931 A1 | * | 7/2014 | Astle ................. H05K 3/288 216/13 |
| 2014/0192464 A1 | * | 7/2014 | Astle ................. H01L 21/56 361/679.01 |
| 2015/0092370 A1 | * | 4/2015 | Astle ................. H01L 21/56 361/765 |
| 2016/0345440 A1 | * | 11/2016 | Kasagani ........... H05K 3/284 |

FOREIGN PATENT DOCUMENTS

| | | |
|---|---|---|
| EP | 1621874 A1 | 2/2006 |
| WO | 2014/110039 A2 | 7/2014 |

OTHER PUBLICATIONS

United States Patent and Trademark Office Acting as the International Searching Authority, "International Search Report and Written Opinion" mailed Nov. 29, 2013 in related international application No. PCT/US2013/046392.

United States Patent and Trademark Office Acting as the International Searching Authority, "International Search Report and Written Opinion," mailed Apr. 30, 2014 in related international application No. PCT/US2014/010526.

United States Patent and Trademark Office acting as the International Searching Authority, "International Search Report and Written Opinion," mailed Jan. 29, 2015, in international patent application No. PCT/US2014/050732.

\* cited by examiner

METHODS FOR MASKING AND APPLYING PROTECTIVE COATINGS TO ELECTRONIC ASSEMBLIES

CROSS-REFERENCE TO RELATED APPLICATION

This application is a continuation of U.S. patent application Ser. No. 13/377,709, filed on Jan. 9, 2013, titled MASKS FOR USE IN APPLYING PROTECTIVE COATINGS TO ELECTRONIC ASSEMBLIES, MASKED ELECTRONIC ASSEMBLIES AND ASSOCIATED METHODS ("the '709 Application"). The '709 Application claims the benefit of priority under 35 U.S.C. §119(e) to U.S. Provisional Patent Application No. 61/584,939, filed on Jan. 10, 2012, titled METHODS FOR MASKING ELECTRONIC DEVICES FOR APPLICATION OF PROTECTIVE RESISTANT COATINGS THERETO, MASKS FOR USE IN APPLYING PROTECTIVE COATINGS TO ELECTRONIC DEVICES AND MASKED ELECTRONIC DEVICES ("the '939 Provisional Application"). The entire disclosures of the '709 Application and the '939 Provisional Application are, by this reference, incorporated herein.

TECHNICAL FIELD

This disclosure relates generally to methods for applying protective (e.g., moisture-resistant, etc.) coatings to electronic assemblies. Such a method may include masking the electronic assembly prior to application of a protective coating to the electronic assembly. The present disclosure also relates to masks that may be used to shield portions of an electronic assembly during coating processes, as well as to masked electronic devices.

SUMMARY

One or more masks may be used to control the application of material of a protective coating, or "protective material," and, thus, the application of a protective coating to one or more portions of various components of an electronic device during assembly of the electronic device. A mask may be planar or substantially planar, or it may be nonplanar. The planarity (or nonplanarity) of a mask may result from the planarity (or nonplanarity) of the electronic assembly over which the mask is formed (e.g., when conformal coating processes are used, when the mask contacts or substantially contacts all of the portions of the surface of the electronic assembly that it covers, etc.).

As used herein, the term "protective coating" includes moisture-resistant coatings, as well as other coatings that protect various parts of an electronic assembly from external influences. The term "moisture-resistant" refers to the ability of a coating to prevent exposure of a coated element or feature to moisture. A moisture-resistant coating may resist wetting or penetration by one or more types of moisture, or it may be impermeable or substantially impermeable to one or more types of moisture. A moisture-resistant coating may repel one or more types of moisture. In some embodiments, a moisture-resistant coating may be impermeable to, substantially impermeable to or repel water, an aqueous solution (e.g., salt solutions, acidic solutions, basic solutions, drinks, etc.) or vapors of water or other aqueous materials (e.g., humidity, fogs, mists, etc.), wetness, etc. Use of the term "moisture-resistant" to modify the term "coating" should not be considered to limit the scope of materials from which the coating protects one or more components of an electronic device. The term "moisture-resistant" may also refer to the ability of a coating to restrict permeation of or repel organic liquids or vapors (e.g., organic solvents, other organic materials in liquid or vapor form, etc.), as well as a variety of other substances or conditions that might pose a threat to an electronic device or its components. Various aspects relating to the use of masks in the application of protective coatings are disclosed.

In one aspect, a method for applying a protective coating to an electronic device includes assembling two or more components of the electronic device with one another. A mask may then be applied to the resulting electronic assembly. The mask may shield selected portions of the electronic assembly, while other portions of the electronic assembly, i.e., those to which a protective coating is to be applied, may remain exposed through the mask. With the mask in place, application of a protective coating to portions of the electronic assembly exposed through the mask may commence. After application of the protective coating, the mask may be removed from the electronic assembly. In some embodiments, one or more additional components may then be added to an electronic assembly to which a protective coating has been applied. Another mask may be applied to this larger electronic assembly, and another protective coating may then be applied to areas of the larger electronic assembly that are exposed through the mask.

In some embodiments, the mask may be formed on the electronic assembly. The mask may be selectively formed on, defined on or applied to areas of the electronic assembly that are exposed, but not to be covered with a protective coating. Without limitation, such areas may include components from which a protective coating may interfere with thermal transmission or features whose functionality may be detrimentally affected by a protective coating. Non-limiting examples of the latter include various transducers (e.g., audio elements, such as microphones, speakers, etc.; camera lenses; etc.), features with moving parts (e.g., silent mode vibrating elements, autofocus elements of camera lenses, etc.), communication components (e.g., communication ports, power ports, audio jacks, etc.), memory card receptacles (e.g., for secure digital (SD) cards, subscriber identity module (SIM) cards, universal serial bus (USB) or micro USB ports, etc.) and the like.

A variety of techniques may be used to form a mask on an electronic assembly, define a mask on an electronic assembly, or otherwise selectively apply a mask to an electronic assembly. As one example, a mask material may be selectively applied to areas of the electronic assembly that are to remain free from coverage by a protective coating. As another example, a mask material may be applied over an entire area of an electronic assembly then selectively removed from locations to which a protective coating is to be applied.

After a protective coating has been applied to portions of an electronic assembly exposed through a mask that was defined on the electronic assembly, the mask may be selectively removed from the electronic assembly. A mask that has been defined in place may be mechanically removed from the electronic assembly. Some non-limiting examples of mechanical removal include peeling and abrasion (e.g., with frozen gas (e.g., carbon dioxide ($CO_2$), nitrogen ($N_2$), etc.), corn starch, sand, glass, etc.). Alternatively, a mask that has been defined in place may be chemically removed from the electronic assembly. In embodiments where chemical removal techniques are employed, the defined-in-place mask may be removed with selectivity over the material of the protective coating (i.e., the protective coating may remain intact over desired locations of the electronic assembly). Although selective chemical removal processes may not have a significant chemical effect on portions of the protective coating that were formed over the mask, those portions of the protective coating may be "lifted off" of the electronic assembly as the mask is chemically removed from the assembly.

In other embodiments, the mask may comprise a preformed apparatus, which may include one or more elements configured to be assembled with the electronic assembly and, optionally, with one or more other elements of the preformed mask. When a preformed mask is used in the application of a protective coating to an electronic assembly, a seal or a sealing agent (e.g., an elastomer, etc.) may be applied to a surface of the electronic assembly, and may reside between the electronic assembly and the mask once the mask is in place on the electronic assembly. In some embodiments, the seal may comprise a part of the preformed mask that is configured for assembly against the electronic assembly. A preformed mask may even be formed from a solid elastomeric material that will function as a seal. In other embodiments, a seal or sealing agent may be configured for application to one or both of the preformed mask and the electronic assembly before the preformed mask is assembled with the electronic assembly. When sufficient force is applied to one or both of the preformed mask and the electronic assembly in the appropriate direction(s), the seal or sealing agent may define a discrete boundary between each masked region and its adjacent region(s) that is (are) to be covered with a protective coating to prevent the introduction of protective material at locations between the electronic assembly and the preformed mask and, thus, may enable the formation of a protective coating with a discrete periphery.

In embodiments where a sealing agent is applied to the electronic assembly or mask, the sealing agent may comprise a material that is configured for selective application. The sealing agent may comprise an elastomer that may be viscous when first applied and subsequently solidify to form a seal and, thus, delineation between coated and uncoated regions. Non-limiting examples of sealing agents that are initially viscous then solidify include liquid latex and hot melt adhesive, which is typically referred to as "hot glue." Alternatively, the sealing agent may remain relatively viscous. Examples of sealing agents that remain relatively viscous include gels, greases and other materials that will maintain their viscosity when subjected to elevated temperatures and/or pressures of the material deposition process.

A preformed mask may comprise one or more features that interact with corresponding features of the electronic assembly to which they are configured to be assembled. In a specific embodiment, a protruding feature may be positioned on an interior surface of the preformed mask to depress a button of the electronic assembly when the preformed mask is positioned on the electronic assembly. In another specific embodiment, a preformed mask may include one or more features that prevent the introduction of protective material into ports (e.g., communication ports, power ports, audio jacks, etc.) or receptacles (e.g., SIM card receptacles, memory card slots, etc.) of the electronic assembly. These features may be configured to cover ports or receptacles to keep the protective material out of these features, or these features may be configured to be received by the ports or receptacles.

Once the protective coating has been formed, a preformed mask may be removed from an electronic assembly merely by disassembling the mask from the electronic assembly. Thereafter, the preformed mask may be cleaned. For example, protective material may coat portions of the preformed mask. A residue of a sealing agent may also remain on surfaces of the preformed mask following its removal from the electronic assembly. Once the mask has been cleaned, it may be reused; i.e., placed on another electronic assembly to mask portions of that electronic assembly as a protective coating is applied to other portions of the electronic assembly.

An electronic assembly may be masked with a combination of preformed elements and elements that are defined on the electronic assembly. In some embodiments, both preformed and defined-in-place mask elements may reside on an electronic assembly concurrently and, thus, be used simultaneously. In other embodiments, one or more mask elements that are defined in place may be used at a different point in the process of assembling an electronic device than masks that include one or more preformed elements.

Embodiments of masked electronic assemblies are also disclosed. A masked electronic assembly includes an electronic assembly and a mask. The mask may include one or more features that are defined in place on the electronic assembly, one or more preformed elements, or a combination of defined-in-place and preformed elements.

Other aspects, as well as features and advantages of various aspects, of the disclosed subject matter will become apparent to those of ordinary skill in the art through consideration of the ensuing description, the accompanying drawings and the appended claims.

DETAILED DESCRIPTION

The disclosed subject matter, in various embodiments, includes methods for shielding selected surfaces or features of electronic assemblies during application of protective coatings (e.g., moisture-resistant coatings, etc.) to the electronic assemblies and/or components of the electronic assemblies. A mask may shield one or more features of the electronic assembly and/or its components for a variety of reasons, including, without limitation, to enable electrical connectivity between components following application of the protective coating to the electronic assembly, to provide access to interactive features of an electronic device of which the electronic assembly is a part, for aesthetic purposes (e.g., to limit or prevent application of the protective coating to one or more exterior features of an electronic device, such as a display, etc.), to prevent interference with various components (e.g., features with moving parts, transducers, communication components, card receptacles, etc.), and to enable the transmission of light or other electromagnetic radiation to or from one or more components of the electronic assembly or a device of which the electronic assembly is a part.

Figure 1:
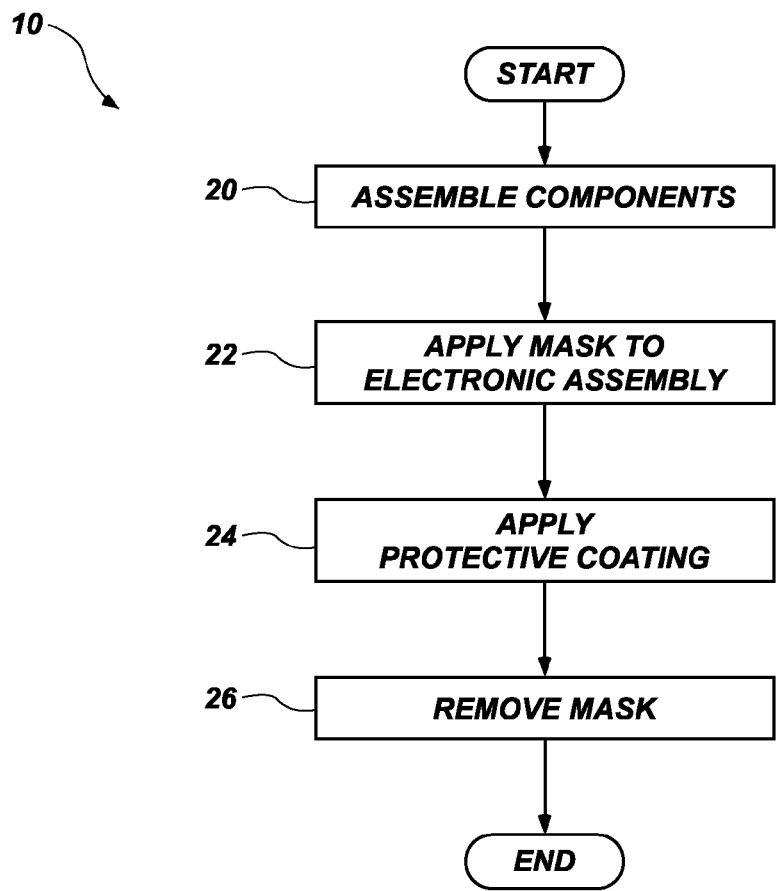
FIG. 1 illustrates an embodiment of a process in which a protective coating is applied to a portion of an electronic assembly, which process includes the assembly of at least two components of an electronic device, application of a mask to the electronic assembly formed by those components, application of the protective coating to the electronic assembly, and removal of the mask from the electronic assembly.
Figure 3:
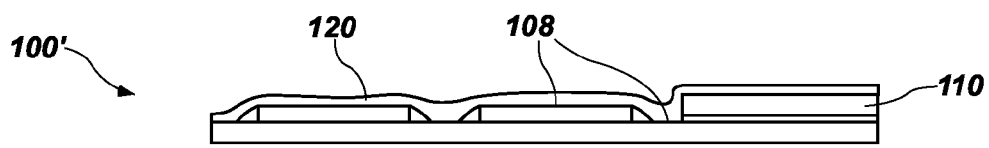
Figure 4:
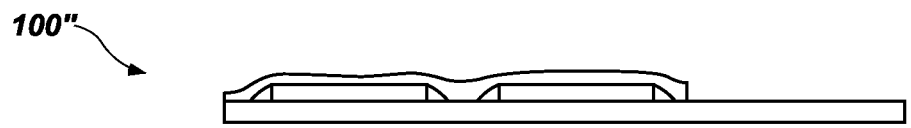

With reference to FIG. 1, a series of elements of a process 10 for applying a protective coating to an electronic assembly is described, as are embodiments of the manner in which masking, coating and related processes may fit into the process of assembling a finished electronic device. Various embodiments of electronic assemblies 100, 100', 100" are shown in FIGS. 2 through 4.

Figure 2:
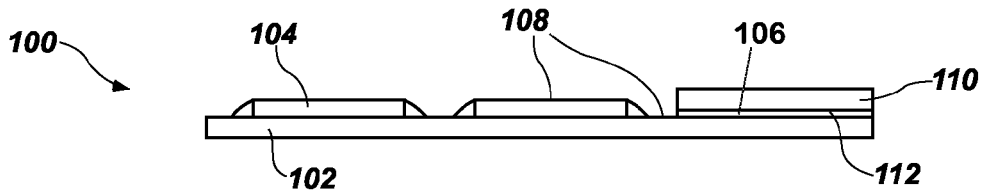
FIGS. 2 through 4 are schematic representations of embodiments of electronic assemblies with masks and/or protective coatings on some, but not all, areas of their surfaces.

At reference 20 of FIG. 1, and with added reference to FIG. 2, two or more components 102, 104 of an electronic device (e.g., a circuit board (e.g., printed wiring board, ceramic board, etc.); another carrier, such as a silicon interposer; etc.) and another electronic component (e.g., a packaged semiconductor device, an antenna, a display, another electronic subassembly including its own circuit board, etc.; two components of an electronic device; etc.) are assembled with one another. The resulting electronic assembly 100 (which may comprise a finished electronic device, a device under assembly or a subassembly) may include features that are to be located within a finished electronic device, features that are to be located on the outside of the finished electronic device or a combination of internal and external features.

In some embodiments, all or part of the electronic assembly 100 may be prepared before applying a mask 110 to selected areas of the electronic assembly 100. Such preparation may include, but is not limited to, processes that will enable the mask 110 to limit the application of one or more protective materials to masked areas of the electronic assembly 100. As another option, preparation of an electronic assembly may prevent adhesion of a mask to certain areas that are to be exposed laterally beyond or through the mask 110. In yet another option, an electronic assembly may be processed to facilitate adhesion of a protective material to certain areas of the electronic assembly 100 to which a protective coating is to be applied. Non-limiting examples of such processes include cleaning processes, processes for applying certain materials (e.g., sealants, release agents, etc.), processes for imparting one or more areas of a surface with a desired texture, and the like. In a specific embodiment, FIG. 2 shows the application of a sealing agent (e.g., by jetted printing, screen printing, spraying, etc.) or a seal 112 (e.g., by assembly processes, etc.) to selected portions of the electronic assembly 100. Alternatively, a seal 112 or sealing agent may be applied to selected portions of a preformed embodiment of a mask 110, or to selected portions of both the electronic assembly 100 and a preformed embodiment of a mask 110.

It may be desirable to prevent the application of a protective coating to one or more surfaces 106 of the electronic assembly 100; application of the protective coating may be limited to unmasked portions 108 of the electronic assembly 100 (i.e., portions that are exposed through the mask 110).

Accordingly, at reference 22 of FIG. 1, a mask 110 is applied to the electronic assembly 100. The mask 110 may be applied to an electronic assembly 100 in a way that prevents the protective material from contacting areas of the electronic assembly 100 that are covered by the mask 110.

Manual or automated processes may be used to apply the mask 110 to the electronic assembly 100. A mask 110 may be formed or otherwise defined on the electronic assembly 100, for example, by applying a mask material to the electronic assembly 100. In some embodiments, the mask material may comprise an unconsolidated material, such as a liquid or uncured material. As an unconsolidated mask material is applied to the electronic assembly 100, it may at least partially conform to the contour of the electronic assembly 100. In some embodiments, including those where the speed with which a mask may be removed is more desirable than the extent to which high aspect ratio features are masked, the mask 110 may only partially conform to the contour of the area of the electronic assembly 100 to which it applied. In other embodiments, an unconsolidated mask material may be applied in a manner that minimizes the likelihood that any gaps will form between the mask 110 and the electronic assembly 100, including situations where reliable masking of high aspect ratio features is desired. In such embodiments, the mask 110 may conform substantially or completely to the contour of the area of the electronic assembly 100 to which it is applied. The viscosity, temperature and/or other properties of a masking material may affect its ability to conform and, thus, the extent to which it conforms to a surface to which it is applied. Once the mask material has been applied to selected locations of an electronic assembly 100, the mask material may then harden or cure. In some embodiments, the application of a mask 110 to an electronic assembly 100 may include additional processing. As a non-limiting example, the mask material may be applied under conditions (e.g., under a vacuum, etc.), at a temperature, etc. that minimizes or prevents the occurrence of gaps between the mask 110 and the electronic assembly 100.

In some embodiments, a mask material may comprise one or more films that are configured to be placed on and secured to the electronic assembly 100. In some embodiments, such a masking film may be subjected to conditions that hold it in place in the electronic assembly 100 and/or secure it to the electronic assembly 100. In addition, a masking film may be subjected to conditions that enable it to conform or substantially conform to the shape(s) of the surface(s) to which the masking film is applied. Without limitation, such conditions may include the selective application of pressure to the masking film in a manner that forces it against the surface(s) that are to be covered by a mask 110. As an example, a positive pressure may be applied to force the masking film against a desired location of the electronic assembly 100. As another example, a negative pressure, such as a vacuum, may be applied to a masking film to draw the masking film against the electronic assembly 100. Optionally, positive pressure and negative pressure may be employed in conjunction with one another; for example, positive pressure may be momentarily applied (e.g., as a burst of gas or air, etc.) to press the masking film against the electronic assembly 100, then a negative pressure may draw the masking film against the electronic assembly 100; holding it in place on the electronic assembly 100. Heat may be applied to a masking film to increase its pliability and, thus, its ability to conform. Heat may also cause the masking film, or an adhesive on the masking film, to adhere to the surface of the electronic assembly 100. In embodiments where each film from which a mask 110 is to be formed comprises a material that will shrink when heated, the masking film and, optionally, the electronic assembly 100 may be heated to enable the material to engage and/or adhere to features of the electronic assembly 100 that it covers. Nonlimiting examples of masking films that will shrink when heated include polyethylene films (e.g., that marketed by 3M Company of Maplewood, Minn., as Polyethylene Protective Tape 2E97C, etc.) and polyvinyl chloride (PVC) films. An adhesive material (e.g., a pressure-sensitive adhesive, a silicone coating, etc.) may be provided on a surface of the masking film to enable it to be temporarily secured to a substrate before it is heated. The thickness of a masking film may depend upon the desired thickness of the mask 110 and, thus, may comprise any of a wide range of thicknesses. By way of non-limiting example, in specific embodiments, a masking film may have a thickness of about 2 mils (i.e., about 0.05 mm) to about 4 mils (i.e., about 0.1 mm).

Masks 110 that are formed on electronic assemblies 100 may be configured for compatibility with the process(es) that will be used to form a protective coating on one or more parts of the electronic assembly 100. As an example, relatively thin masks 110 may be used when a protective coating will be formed by directional or anisotropic deposition processes to avoid the occurrence of unprotected areas adjacent to the outer periphery of the mask 110, which might otherwise occur due to shadowing if the mask 110 were thicker. As another example, when anisotropic deposition processes will be used to form a protective coating, masks 110 with openings that have one or more dimensions that exceed the mean free path of particles or molecules of protective material may be used to ensure that the thickness throughout the protective coating is uniform. Conversely, a protective coating may be formed with areas that have different thicknesses than one another by forming a mask 110 with at least one opening that has one or more dimensions that exceed the mean free path of the particles or molecules that will form the protective coating and at least one opening that has one or more dimensions that are smaller than the mean free path of the particles or molecules of protective material that will form the protective coating. In yet another example, masks 110 that maintain good adhesion with, and remain in close contact with, electronic assemblies 100 when subjected to the conditions under which protective layers are formed are useful with a variety of different processes, including isotropic (i.e., multi-directional or from all directions) deposition processes, where protective material might otherwise creep under the edges of a mask 110.

Alternatively, a preformed mask 110 may be placed on, or assembled with, the electronic assembly 100. Assembly of the preformed mask 110 with the electronic assembly 100 may be effected in such a way that the preformed mask 110 exerts force against the electronic assembly 100, which may hold the preformed mask 110 in place and prevent exposure of areas covered by the preformed mask 110 to protective material. Such force may be achieved by application of pressure or force. For example, a negative pressure, such as a vacuum, may be applied to the mask 110 to pull it against the electronic assembly 100. As another example, a positive pressure or force may be applied to the mask 110 to hold it against the electronic assembly 100.

A mask 110 that incorporates teachings of this disclosure may have a three-dimensional structure. In some embodiments, a mask 110 may extend over portions of surfaces of an electronic assembly 100 that face in opposite or substantially opposite directions. As an example, a mask 110 may cover at least portions of opposite surfaces of an electronic assembly 100 or of a component of an electronic assembly 100. In another example, a mask 110 may cover opposing, or facing, spaced-apart surfaces of two or more components.

Turning now to FIG. 3, and at reference 24 of FIG. 1, with the mask 110 in place, a protective coating 120 may be selectively applied to unmasked portions 108 of the electronic assembly 100'. A variety of processes may be used to apply a protective coating 120 to unmasked portions 108 of the electronic assembly 100', including, without limitation, those disclosed by U.S. patent application Ser. No. 13/736,753, filed on Jan. 8, 2013 and titled SYSTEMS FOR ASSEMBLING ELECTRONIC DEVICES WITH INTERNAL MOISTURE RESISTANT COATINGS ("the '753 Application") and those disclosed by U.S. patent application Ser. No. 13/735,862, filed on Jan. 7, 2013 and titled ELECTRONIC DEVICES WITH INTERNAL MOISTURE RESISTANT COATINGS ("the '862 Application"). The entire disclosures of both the '753 Application and the '862 Application are, by this reference, incorporated herein.

Thereafter, at reference 26 of FIG. 1, the mask 110 may be removed from the electronic assembly 100', leaving the protective coating 120 on selected portions (i.e., the previously unmasked portions 108) of the electronic assembly 100'. An illustrative embodiment of the resulting electronic assembly 100" is shown in FIG. 4.

The masking and coating processes could occur during assembly of an electronic device and/or once assembly of the electronic device is complete. A mask may be applied manually, by automated equipment, or by a combination of both manual and automated processes. When masking and coating occur during assembly of an electronic device, the mask may be applied to an electronic assembly 100 (FIG. 2) immediately before a protective coating is formed on the electronic assembly 100, or the mask may be applied to the electronic assembly 100 at one or more points during the assembly process that are most convenient or at which application of the mask 100 are most easily achieved. In some embodiments, more than one protective coating may be applied to an electronic assembly 100 and/or its components, in various stages of assembly. Accordingly, an assembly process may include a plurality of masking processes, a plurality of coating processes and a plurality of mask removal, or "de-masking," processes.

In embodiments where a protective coating is applied to a finished electronic device 100''' (which may take the place of the electronic assembly 100 in the process depicted by FIG. 1), some disassembly of the electronic device 100''' may provide access to the components that require masking.

Figure 5:
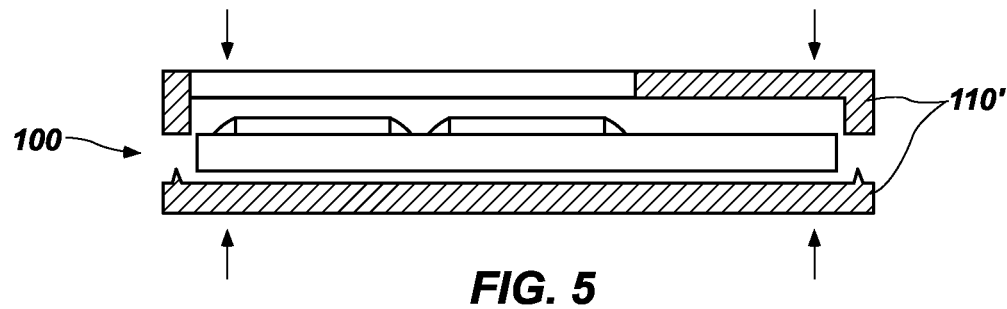
FIG. 5 depicts an embodiment of a preformed mask configured to be placed on and disassembled from surfaces of an electronic assembly that are configured to be located within an interior of an electronic device.

Masking and coating may be followed by removal of the mask. When the mask has been formed on an electronic assembly 100 (FIG. 2) or on an electronic device 100''', it may be removed mechanically (e.g., by peeling, abrasion, etc.), chemically (e.g., by etching or dissolving material of the mask with selectivity over removal of the protective coating, etc.), by radiation (e.g., with laser beams, electron beams, X-rays, high intensity light, etc.), or by any other suitable means for mask removal. In embodiments where the mask comprises one or more preformed elements (see, e.g., FIGS. 5 and 6), removal of the mask may comprise disassembly of the mask from the electronic assembly 100.

Individual components of an electronic assembly or the interior of an electronic device may be shielded from application of a material that forms a protective coating. These components may include electrical contacts, light transmission elements (e.g., cameras, projectors, etc.), sensors, and other components. These components may be masked with a reusable or disposable system that is specifically configured for the component geometry and location. This system may include a predetermined number of contact covers that can be applied to the electronic devices. The covers could be affixed by an adhesive, an elastic/pressure connection, a static connection, and/or geometrical constraints. This system could be made from multiple material types for both structural support and to ensure uniform contact to the shielded component. The points of contact to the electronic assembly or electronic device may uniformly and effectively seal the shielded feature or component from the protective coating deposition. These contact points may comprise a soft material (e.g., a polymer, such as silicone or latex, etc.), a grease, a gel, a curable liquid, or the like.

Figure 6:
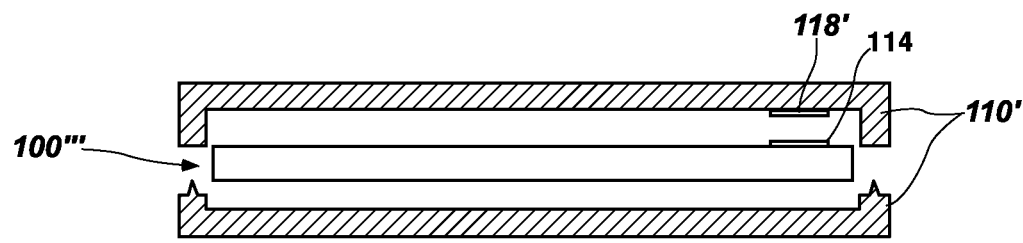
FIG. 6 shows an embodiment of a preformed mask with at least one feature that interacts with a corresponding feature of an electronic assembly or an electronic device when the preformed mask is placed on the electronic assembly or electronic device.

A preformed mask 110', such as that depicted by FIG. 6, may be configured to shield the exterior of a finished electronic device 100''' from a protective coating material. A preformed mask 110' may have any of a variety of configurations. Without limitation, a preformed mask 110' may include a snap-in fixture; a multi-part fixture that snaps or adheres together; a shrink-wrap coating that is activated by heat, UV radiation, or some other curing mechanism; a silicone or other polymer type cover; a cover that uses static or Van der Waals interactions to adhere; a gel or liquid that is applied to the exterior and cured; and masks that are printed directly on to the device exterior. A preformed mask may be disposable (i.e., configured to be used once) or it may be reusable. Following use, a reusable embodiment of a preformed mask may be cleaned or otherwise prepared before it is again applied to an electronic assembly or an electronic device.

In embodiments where the electronic device 100''' includes one or more interface elements 114 (e.g., buttons, dials, switches, etc.), it may be desirable to shield one or more of the interface elements 114 from the protective coating. In some embodiments, it may be desirable to ensure that an interface element 114 (e.g., a button, switch, etc.) will make the necessary electrical contacts when placed in an "on" or connected position. In such embodiments, the preformed mask 110' may include one or more features 118' (e.g., protrusions, etc.) for engaging a corresponding interface element 114 in the desired position (e.g., by depressing a button, by holding a switch in the appropriate position, etc.). Alternatively, one or more inserts may be assembled with the electronic device 100''' and/or the preformed mask 110'. In any embodiment, the material and/or construction of the preformed mask 110' (e.g., its rigidity, stiffness, elasticity, shape, etc.) may enable such a feature 118' to accomplish its intended task.

In an alternative embodiment, an external feature (e.g., a tension band, etc.) may be assembled or otherwise used in conjunction with a mask (preformed or formed on the electronic assembly or electronic device) to apply any force needed to engage and maintain an interface element 118' in a desired position while a protective coating is applied to all or part of an electronic assembly 100 (FIG. 2) or electronic device 100'''.

In embodiments where the mask is formed on an electronic assembly or an electronic device, all or part of the electronic assembly or electronic device may be masked by applying a masking material that may cure or otherwise harden to define a mask. As a non-limiting example, the masking material may comprise a liquid material or a gel material that may harden or cure over time or that may be cured by exposure to heat, a catalyst, electromagnetic (e.g., ultraviolet (UV), etc.) radiation, or another curing agent or condition.

In some embodiments, a selectively curable material (e.g., a radiation curable material, etc.) may also, or alternatively, be employed as a moisture-resistant coating on portions of an electronic component, an assembly of electronic components, or an electronic device.

Figure 7:
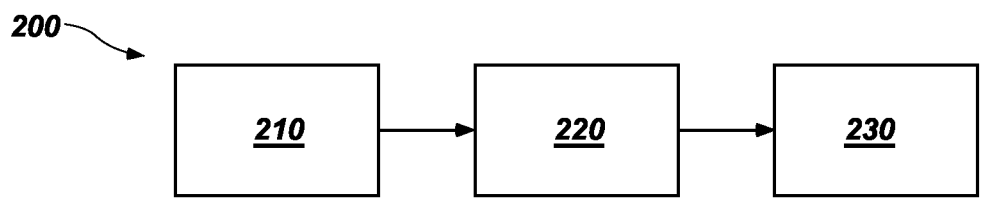
FIG. 7 illustrates an embodiment of a system for applying protective coatings to electronic assemblies, showing a masking element, a protective coating element and a demasking element.

In another aspect, a system for applying a protective coating to an electronic assembly (see, e.g., the '753 Application and the '862 Application) may include a masking element, or station, that is configured to form a mask in accordance with teachings of this disclosure. Additionally, such a system may include one or more mask removal elements, or stations, also employing teachings of this disclosure. FIG. 7 illustrates an embodiment of a system 200 for applying protective coatings to electronic assemblies, showing a masking element 210, a protective coating element 220 and a de-masking element 230. As a plurality of protective coatings may be applied to an electronic assembly, or electronic assemblies at various stages of assembly, during the assembly components to manufacture an electronic device, a system 200 may include a corresponding number of masking elements 210, protective coating elements 220 and de-masking elements 230.

Although the foregoing description contains many specifics, these should not be construed as limiting the scope of any of the appended claims, but merely as providing information pertinent to some specific embodiments that may fall within the scopes of the appended claims. Features from different embodiments may be employed in combination. In addition, other embodiments of the disclosed subject matter may also be devised which lie within the scopes of the appended claims. The scopes of the claims are, therefore, indicated and limited only by the plain language used in each claim and the legal equivalents to the elements recited by the claims. All additions, deletions and modifications to the disclosed subject matter that fall within the meaning and scopes of the claims are to be embraced by the claims.

What is claimed:

1. A method for coating an electronic device, comprising:
   assembling at least first and second components of an electronic device to form an electronic assembly, the first component including at least one of an exterior component of the electronic device, light emission element of the electronic device, an imaging element of the electronic device, or a sensor of the electronic device;
   applying a mask over at least one of the light emission element, the imaging element or the sensor of the electronic assembly, the mask shielding the light emission element, the imaging element or the sensor, wherein the mask covers portions of opposite surfaces of the electronic assembly;
   applying a water-resistant protective coating to at least two components of the electronic assembly with the mask in place; and
   removing the mask from the electronic assembly, the water-resistant protective coating remaining on coated portions of the electronic assembly, uncoated portions of the electronic assembly, including the light emission element, the imaging element or the sensor, being exposed through removal of the mask.

2. The method of claim 1, wherein applying the mask comprises applying a fluid masking material.

3. The method of claim 2, further comprising: hardening the fluid masking material to form the mask.

4. The method of claim 3, wherein hardening the fluid masking material comprises curing the fluid masking material.

5. The method of claim 2, wherein removing the mask comprises mechanically removing the mask from the electronic assembly.

6. The method of claim 2, wherein removing the mask comprises chemically removing the mask from the electronic assembly, the chemically removing being effected without removing the protective coating.

7. The method of claim 1, wherein applying the mask comprises assembling a mask with the electronic assembly, the mask covering the at least one light emission element, the at least one imaging element or the at least one sensor of the electronic assembly.

8. The method of claim 7, wherein removing the mask from the electronic assembly comprises disassembling the mask from the electronic assembly.

9. The method of claim 8, further comprising:
cleaning the mask after disassembling the mask from the electronic assembly; and
assembling the mask with another electronic assembly.

10. The method of claim 7, wherein assembling the mask comprises assembling a plurality of electronic assemblies with the mask.

11. The method of claim 1, wherein assembling the at least first and second components comprises assembling a plurality of components to be located at least partially within an interior of the electronic device.

12. The method of claim 1, wherein the at least one exterior component of the electronic device defines at least a portion of an interior of the electronic device, at least a portion of the protective coating and at least a portion of the electronic assembly located within the interior of the electronic device.

13. The method of claim 1, further comprising:
after removing the mask, assembling at least one additional component with the electronic assembly;
applying another mask to the electronic assembly to shield at least a portion of the at least one additional component;
applying another protective coating over the another mask and to at least a portion of the at least one additional component exposed through the another mask; and
removing the another mask from the electronic assembly, the another protective coating remaining on a coated portion of the additional component, at least one uncoated portion of the electronic assembly being exposed through the another mask.

* * * * *